United States Patent [19]

Minakuchi

[11] Patent Number: 4,473,819
[45] Date of Patent: Sep. 25, 1984

[54] DIGITAL-TO-ANALOG CONVERSION APPARATUS WITH A VARIABLE ACTIVE-LEVEL

[75] Inventor: Hiroshi Minakuchi, Shiga, Japan

[73] Assignee: Matsushita Electric Industrial Co., Ltd., Osaka, Japan

[21] Appl. No.: 345,919

[22] Filed: Feb. 4, 1982

[30] Foreign Application Priority Data

Feb. 5, 1981 [JP] Japan ............................... 56-16517

[51] Int. Cl.³ .......................................... H03K 13/02
[52] U.S. Cl. ........................ 340/347 DA; 340/347 M
[58] Field of Search ................... 340/347 M, 347 DA; 455/179, 195; 328/157

[56] References Cited

U.S. PATENT DOCUMENTS 3,603,977  9/1971  Szabo ............................... 235/310 X
4,058,772  11/1977  Mogi et al. ............................ 455/179

OTHER PUBLICATIONS

Schmid, Electronic Analog/Digital Conversions, Van Nostrand Reinhold Co., 1970, pp. 211-216.
S. Matsu-ura et al., Low-Cost Digital Tuning System with Full-Function Automatic Search Preset, Nov. 1978, pp. 545-552.

Primary Examiner—T. J. Sloyan
Attorney, Agent, or Firm—Wenderoth, Lind & Ponack

[57] ABSTRACT

A digital-to-analog conversion apparatus for converting a digital input value into an output signal having an active-level duration which varies analog-like depending on the input value. The apparatus consists of a binary counter and several decoding-gates, which thereby form a digital-to-analog conversion system which is simple in construction and has a high stability at high frequency.

1 Claim, 7 Drawing Figures

DIGITAL-TO-ANALOG CONVERSION APPARATUS WITH A VARIABLE ACTIVE-LEVEL

FIELD OF THE INVENTION

This invention relates to a digital-to-analog conversion apparatus which is so constructed that the active level duration of an output signal during a reference period changes corresponding to a digital input value.

DESCRIPTION OF THE PRIOR ART

Conventionally, this kind of digital-to-analog converter has been usually employed as is disclosed in "Digital Signal Processing LSI for Home VTR Servo Circuit", IEEE Transactions on Consumer Electronics, Vol. CE-25, pages 429–438 by Tamura et al., and a normalized logical diagram is shown in FIG. 1.

In FIG. 1, T flip-flops 1, 2, 3, 4, 5, 6 and 7 constitute a 7-bit down-counter, inverted output terminals $\overline{Q1}$ to $\overline{Q7}$ of the respective T flip-flops 1 to 7 are connected to input terminals of an AND gate 8 for detecting an end of down-counting, and an output terminal of AND gate 8 is connected to a set terminal of a RS flip-flop 10.

While, between the non-inverted output terminals Q1 to Q7 and digital input terminals D1 to D7 are interposed EX-OR gates 11, 12, 13, 14, 15, 16 and 17, and output terminals thereof are connected to input terminals of an AND gate 18 for respectively detecting coincidence. An output terminal of AND gate 18 is connected to a reset terminal of RS flip-flop 10, thereby applying an output thereof to an output terminal OUT. Also, clock terminal T1 is connected to a clock pulse input terminal CL.

Now, EX-OR gates 11 to 17 and AND gate 18 in FIG. 1, constitute the digital comparator disclosed in the aforesaid IEEE Papers, which generates a reset signal for RS flip-flop 10 when the digital input value which appears on digital input terminals D1 to D7 coincides with an inverted counting value of the 7-bit down-counter. AND gate 8 generates a set signal for RS flip-flop 10 at the end of counting of the down-counter.

For example, when digital input value [1001110] is given, an output level of the terminal OUT turns to "0" when the output of the down-counter becomes [0110001], and returns to "1" when the output becomes [0000000], and thereafter the same operation will be repeated.

If the active level is chosen to be "1", the active-level duration during a reference period of the output signal on the terminal OUT (in FIG. 1, the reference period corresponds to the count-end period of the down-counter) varies as shown in FIG. 2, corresponding to a change of the digital input values, the active-level duration being shown by the cross hatching FIG. 2.

In addition, in FIG. 2, reference CL designates a clock pulse signal waveform, and Q7, Q6, Q5, Q4, Q3, Q2 and Q1 designate respective output signal waveforms of T flip-flops 7, 6, 5, 4, 3, 2 and 1 in FIG. 1.

Thus, the analog voltage corresponding to the digital input value is obtained from a low-pass filter or the like which is supplied with the output signal from the terminal OUT. Or, in a case of driving a light-emitting diode or a filament lamp, the reference period, when increased to such an extent that flickering is not noticeable, can change the intensity of illumination so as to correspond to the digital input value, even without using the low-pass filter or the like.

The digital-to-analog convertor shown in FIG. 1 also cannot be expected to perform its desired function because of the generation of glitches in its circuit. In other words, a signal transfer delay inevitably occurs between the input and the output of each flip-flop in FIG. 1 to result in a coincidence detection by AND gate 18 during the transition of the output of each flip-flop, thereby generating an erroneous output.

FIG. 3 is a timing chart for explanation of the above, which is similar to that shown in FIG. 2, but having an enlarged axis in comparison with FIG. 2. The transfer delay which is assumed to be equal to 1/6 of the clock pulse period occurs in each flip-flop, but AND gates 8 and 18 and EX-OR gates 11 to 17, for convenience, are assumed to have a negligible transfer delay.

At a time $t_1$, an output of the down-counter becomes [0000000] and AND gate 8 generates a set signal for RS flip-flop 10 as shown by the signal waveform S in FIG. 3.

If we assume that [1000011] is applied as the digital input value, the output of the down-counter becomes [0111100] at a time $t_{10}$, whereby AND gate 18 generates a reset signal for RS flip-flop 10.

Hence, the level change of an output terminal $Q_e$ of RS flip-flop 10 is delayed by 1/6 of one clock period from the time $t_1$ and turns to "1", then is delayed by 1/6 of one clock period from the time $t_{10}$ and turns to "0".

Similarly, when [1000010] is applied as the digital input value, the level of output terminal $Q_e$ at RS flip-flop 10 turns to "1" after a delay from the time $t_1$ of 1/6 of one clock period, and turns to "0" after a delay of 1/6 of one clock period from $t_8$.

Furthermore, when [1000001] is applied as the digital input value, the level of output terminal $Q_e$ at RS flip-flop 10 turns to "1" after a similar delay from the time $t_1$, then turns to "0" after a similar delay from the time $t_8$.

In FIG. 3, the output signal active-level durations of the respective digital input values [1000011], [1000010] and [1000001], when compared with each other, are found not to exactly correspond to a change of the digital input values.

In other words, the active level duration should decrease by one clock period, but actually decreases by only by 5/6 of a clock period between the digital input values [1000011] and [1000010] and decreases by 7/6 of a clock period between the digital input values [1000010] and [1000001], so that an error of 1/6 clock period is created in both cases. In brief, the digital-to-analog converter in FIG. 1 makes a transfer error corresonding to a signal transfer delay time of the T flip-flop constituting the down-counter.

When a digital input value [1000010] is applied, although a glitch $h_1$ is generated at the time $t_{10}$ after the level of reset terminal of RS flip-flop 10 returns to "0", since the RS flip-flop 10 has already been reset at that time, the operation is not affected.

However, the glitch, when [1000000] is applied as the digital input value, leads to a malfunction in the apparatus. Since the output of the down-counter instantaneously becomes [0111111] at the time $t_3$, a glitch $h_2$ is applied to a reset terminal R of RS flip-flop 10, and as a result thereof the output level of the RS flip-flop turns to "0" and its output signal is accordingly far different from the original waveform.

In the case where [0111111], [0111101] or [0111100] is applied as the digital input value, the influence of a glitch can again be avoided, but an error due to the signal transfer delay still occurs.

In order to avoid the above problems, the counter comprising T flip-flops 1 to 7 is made synchronous and uses high speed flip-flops so that a glitch appearance region is kept within at least ½ clock period from the leading edge of the clock pulse and thereafter, the synchronized output of the digital comparator is picked up at the trailing edge of the clock pulse.

These countermeasures, however, are defective in that they require an increase in the number of gates or an increased consumption of power.

In addition, the portions surrounded by the broken line in FIG. 1, for example, in a servo system of a video tape recorder disclosed in the aforesaid IEEE paper, will require four channels for speed control and phase control for a capstan motor and for a cylinder motor, but the portion must employ all high-speed gates for preventing a malfunction. Especially, when the whole system is intended to be a one-chip-IC, many problems have occured due to the increased consumption power and increased chip size.

SUMMARY OF THE INVENTION

An object of the invention is to provide a digital-to-analog conversion apparatus with a high-speed response.

Another object of the invention is to provide a digital-to-analog conversion apparatus which is simplier in construction, and in turn requires a smaller number of gates, than the conventional apparatus.

The digital-to-analog conversion apparatus is so constructed such that a counter for scaling clock pulses and a decoding-gate for generating an output pulse having a binary weighted duration, generate an output signal which varies the sum of the active-level duration, thereby being capable of operating stably up to high frequency with an extremely small number of gates and having a reduced power consumption.

DESCRIPTION OF THE PREFERRED EMBODIMENT

Figure 1:
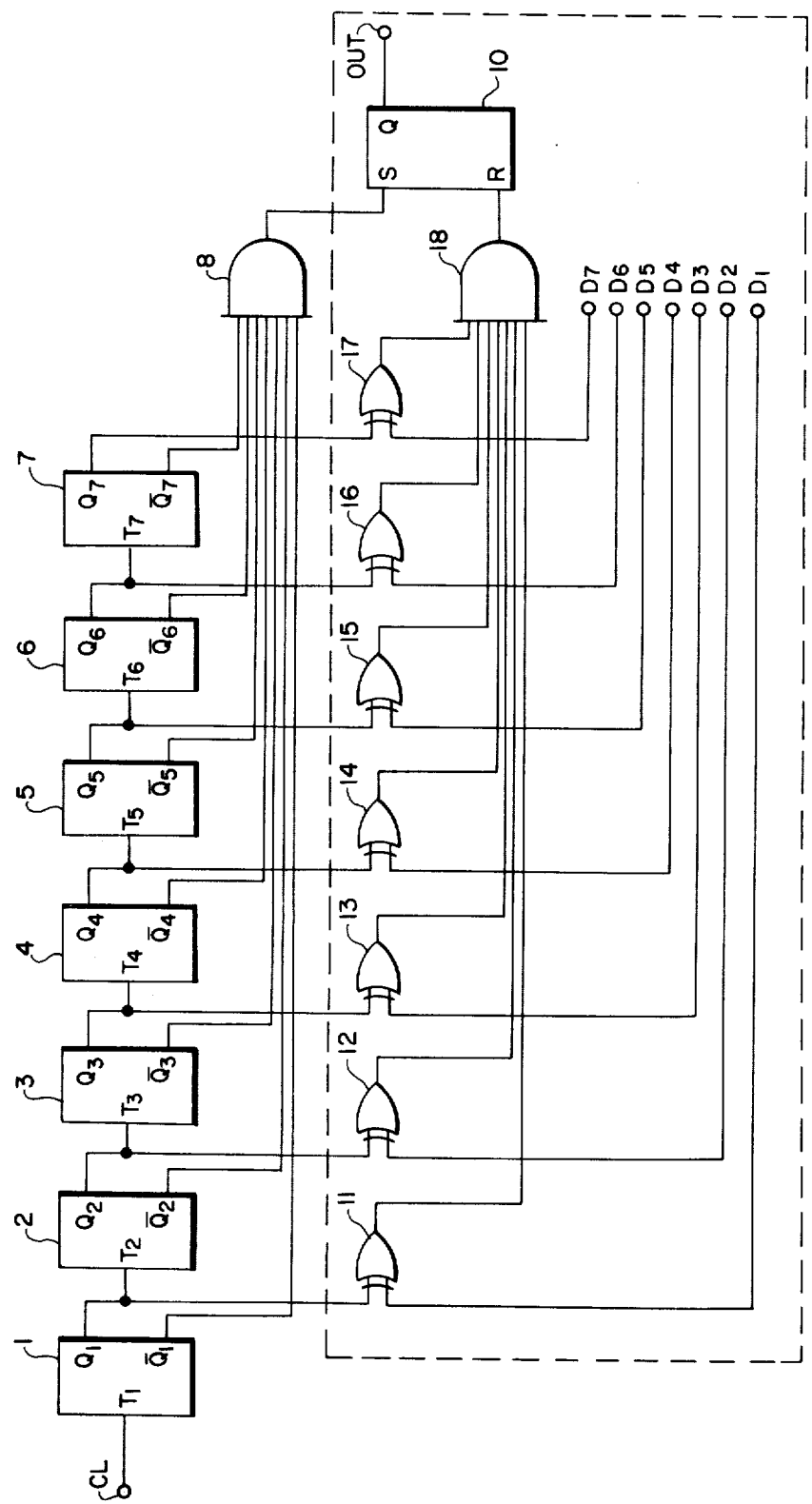
FIG. 1 is a logic diagram of an exemplary construction of a conventional digital-to-analog converter.
Figure 2:
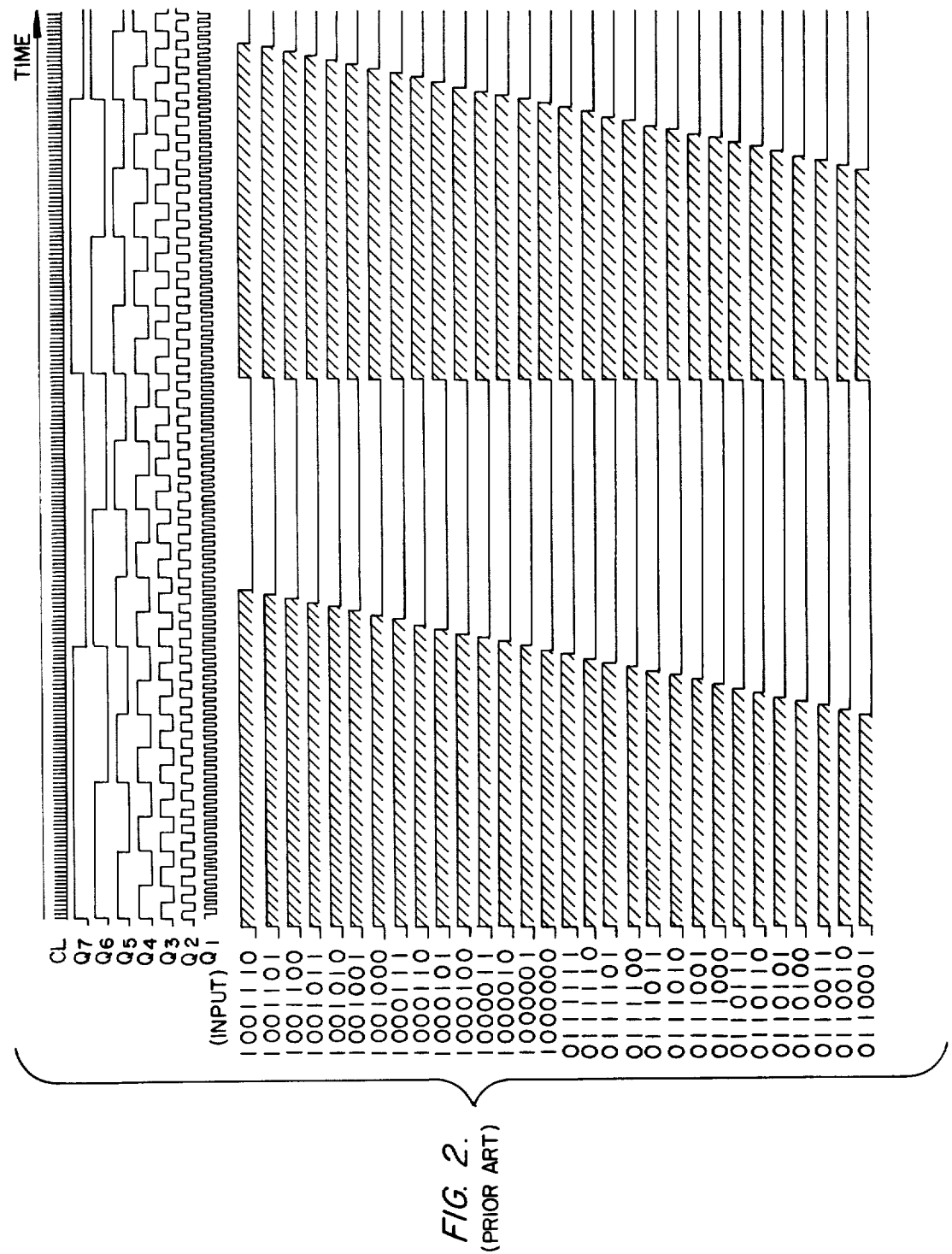
FIGS. 2 and 3 are timing charts explanatory of the operation of the FIG. 1 converter.
Figure 4:
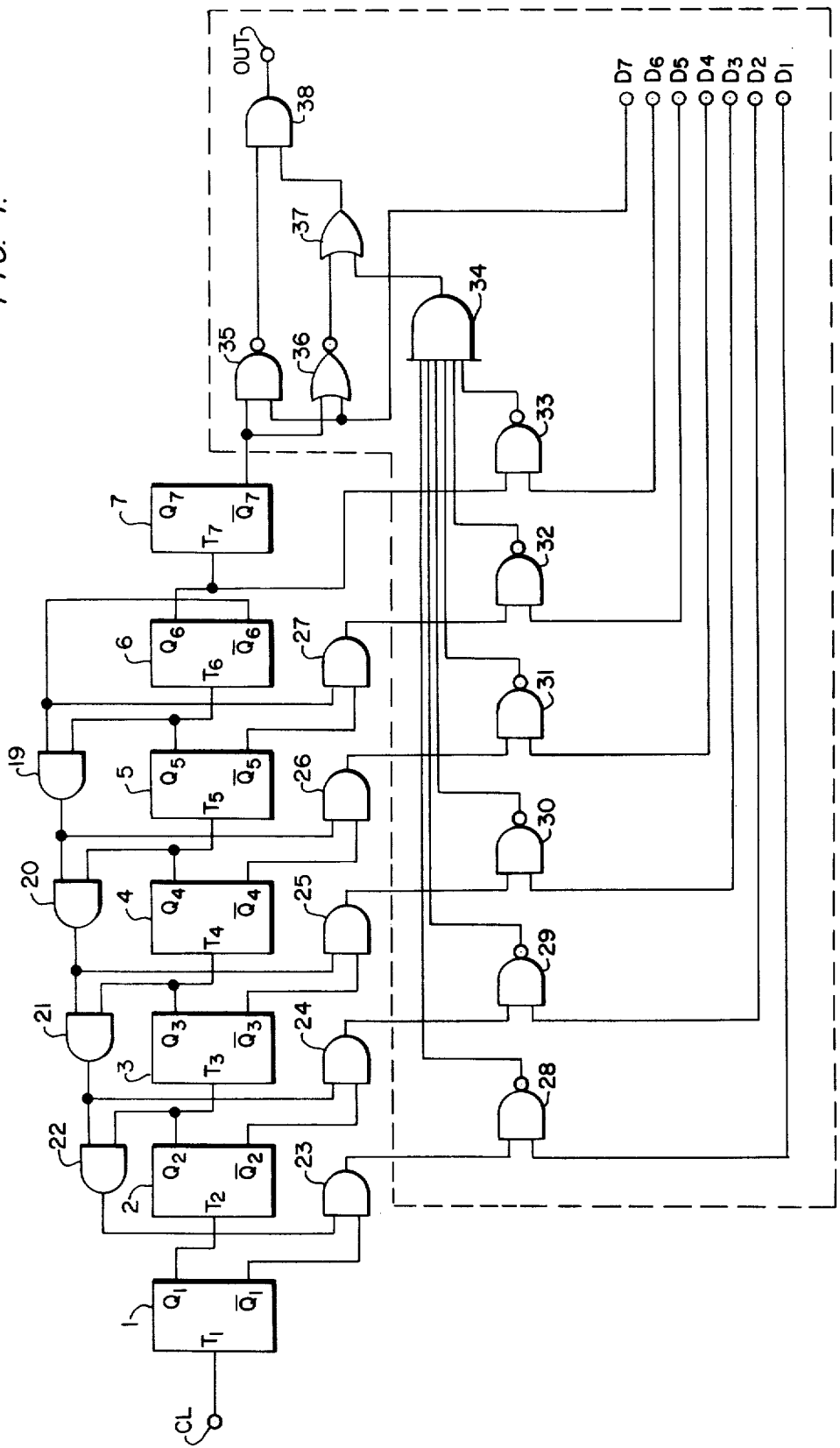
FIG. 4 is a logic diagram of an embodiment of a digital-to-analog conversion apparatus of the invention.

FIG. 4 is a logic diagram of an embodiment of a digital-to-analog conversion apparatus in accordance with the present invention, in which T flip-flops 1 to 7 are the same as those shown in FIG. 1 and constitute a 7-bit down counter; an inverted output terminal $\bar{Q}_6$ of T flip-flop 6 and a non-inverted output terminal $Q_5$ of T flip-flop 5 are connected to input terminals of an AND gate 19; an output terminal of AND gate 19 and a non-inverted output terminal $Q_4$ of T flip-flop 4 are connected to input terminals of an AND gate 20; an output terminal of AND gate 20 and a non-inverted output terminal $Q_3$ f T flip-flop 3 are connected to input terminals of an AND gate 21; an output terminal of AND gate 21 and a non-inverted output terminal $Q_2$ of T flip-flop 2 are connected to input terminals of AND gate 22. An output terminal of AND gate 22 and an inverted output terminal $\bar{Q}_1$ of T flip-flop 1 are connected to input terminals of an AND gate 23; an output terminal of AND gate 21 and an inverted output terminal $\bar{Q}_2$ of T flip-flop 2 are connected to input terminals of an AND gate 24; an output terminal of AND gate 20 and an inverted output terminal $\bar{Q}_3$ of T flip-flop 3 are connected to input terminals of an AND gate 25; an output terminal of AND gate 19 and an inverted output terminal $\bar{Q}_4$ of T flip-flop 4 are connected to output terminals of an AND gate 26; and an inverted output terminal $\bar{Q}_6$ of T flip-flop 6 and an inverted output terminal $\bar{Q}_5$ of T flip-flop 5 are connected to input terminals of an AND gate 27.

Furthermore, an output terminal of AND gate 23 and a digital input terminal $D_1$ are connected to input terminals of a NAND gate 28; an output terminal of AND gate 24 and a digital input terminal $D_2$ are connected to input terminals of a NAND gate 29; an output terminal of AND gate 25 and a digital input terminal $D_3$ are connected to input terminals of a NAND gate 30; and output terminal of AND gate 26 and a digital input terminal $D_4$ are connected to input terminals of a NAND gate 31; an output terminal of AND gate 27 and a digital input terminal $D_5$ are connected to input terminals of a NAND gate 32; a non-inverted output terminal $Q_6$ and a digital input terminal $D_6$ are connected to input terminals of a NAND gate 33; and output terminals of NAND gates 28 to 33 are respectively connected to input terminals of an AND gate 34.

On the other hand, an inverted output terminal $\bar{Q}_7$ of T flip-flop 7 and a digital input terminal $D_7$ are respectively connected to input terminals of a NAND gate 35 and a NOR gate 36, an output terminal of NOR gate 36; and an output terminal of AND gate 34 are connected to input terminals of an OR gate 37; an output terminal of NAND gate 35 and an output terminal of OR gate 37 are connected to input terminals of an AND gate 38; and an output terminal of AND gate 38 is connected to a signal output terminal OUT.

Referring to FIG. 4, AND gate 23 constitutes a first decoding gate which generates an output signal when the 7-bit down-counter comprising T flip-flops 1 to 7 outputs [x011110] (where x designates an irrelevant output level). Also, AND gate 24 constitutes a second decoding gate which generates an output signal when the down-counter outputs [x01110x]; AND gate 25 constitutes a third decoding gate for generating an output signal when the output of the down-counter becomes [x0110xx]; AND gate 26 constituting a fourth decoding gate for generating an output signal when the output of the down-counter becomes [x010xxx]; the AND gate 27 constitutes a fifth decoding gate for generating an output signal when the output of the counter becomes [x00xxxx]; and AND gates 19, 20, 21 and 22 respectively constitute auxiliary gates for decoding gates 23 to 27.

The first decoding gate 23 twice generates output signals when the down-counter outputs [1011110] and [0011110], wherein each output duration is equal to a clock pulse period. The second decoding gate 24 twice generates output signals when the output of the down-counter is between [1011101] and [1011100] and between [0011101] and [0011100], wherein each output duration is equal to two times the clock pulse period. The third decoding gate 25 twice generates output signals when the output of the down-counter is between [1011011] and [1011000] and between [0011011] and

[0011000], wherein each output duration is equal to four times the clock pulse period. The fourth decoding gate 26 twice generates the output signals when the output of the down-counter is between [1010111] and [1010000] and between [0010111] and [0010000], wherein each output duration is equal to eight times the clock pulse period. The fifth decoding gate 27 twice generates the output signals when the output of the down-counter is between [1001111] and [1000000] and between [0001111] and [0000000], wherein each output duration is equal to sixteen times the clock pulse period.

In other words, the second decoding gate 24 is binary-weighted for its output duration with respect to the first decoding gate 23, and similarly, the third, fourth, and fifth decoding gates 25, 26 and 27 are respectively binary weighted for output durations thereof with respect to the second, third, and fourth decoding gates 24, 25 and 26.

NAND gates 28, 29, 30, 31, 32 and 33 constitute logical AND gates for generating output signals when the levels of both input terminals of the NAND gates turn to "1"; AND gate 34 constitutes a negative logical OR gate which generates an output signal when the level of either one input terminal of the AND gate 24 turns to "0".

NAND gate 35, NOR gate 36, OR gate 37 and AND gate 38 constitute a selection gate which decides an effective active region of AND gate 34 corresponding to a level of the MSB in the digital input value.

When the level of the MSB $D_7$ is "1", the output level of NOR gate 36 is fixed principally to "0", and when the level of MSB ($Q_7$) of the 7-bit down-counter is "0", the output level of NAND gate 35 turns to "0" and the level of the output terminal OUT also turns to "0"; when the level of the MSB of the 7-bit down-counter is "1", the output level of NAND gate 35 is fixed principally to "1", whereby the output level of the AND gate 34 appears directly on the output terminal OUT.

On the other hand, when the level of the MSB $D_7$ is "0", the output level of NAND gate 35 is fixed principally to "1" and output level of OR gate 37 appears directly on the output terminal OUT. In other words, when the level of the MSB of the 7-bit down-counter is "1", the output level of NOR gate 36 turns to "1", whereby the level of the output terminal OUT turns to "1" regardless of the output of AND gate 34. When the level of the MSB of the 7-bit down-counter is "0", the output level of NOR gate 36 turns to "0", whereby the output level of AND gate 34 appears directly on the output terminal OUT.

Figure 5:
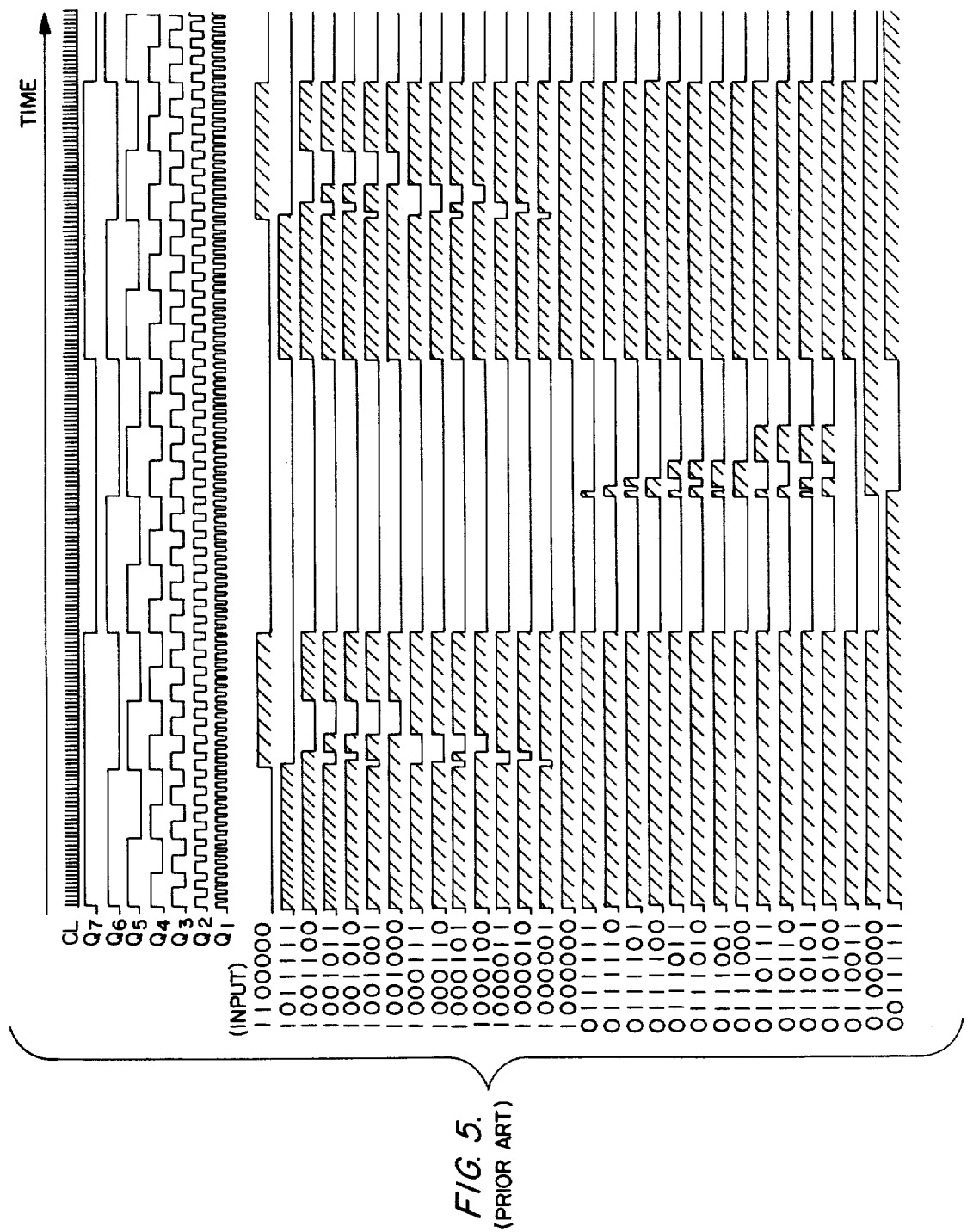
FIGS. 5 through 7 are timing charts explanatory of the operation of the FIG. 4 embodiment.

Finally, the active level duration of the output signal, when the digital input values are changed, changes as shown in FIG. 5, and the active level duration during the reference period changes corresponding to a change of the digital input values.

as seen from FIG. 5, while the apparatus in FIG. 1 performs the digital-to-analog conversion by PWM (pulse width modulation), the embodiment of the invention in FIG. 4 performs the same by BPM (bit pattern modulation).

Figure 3:
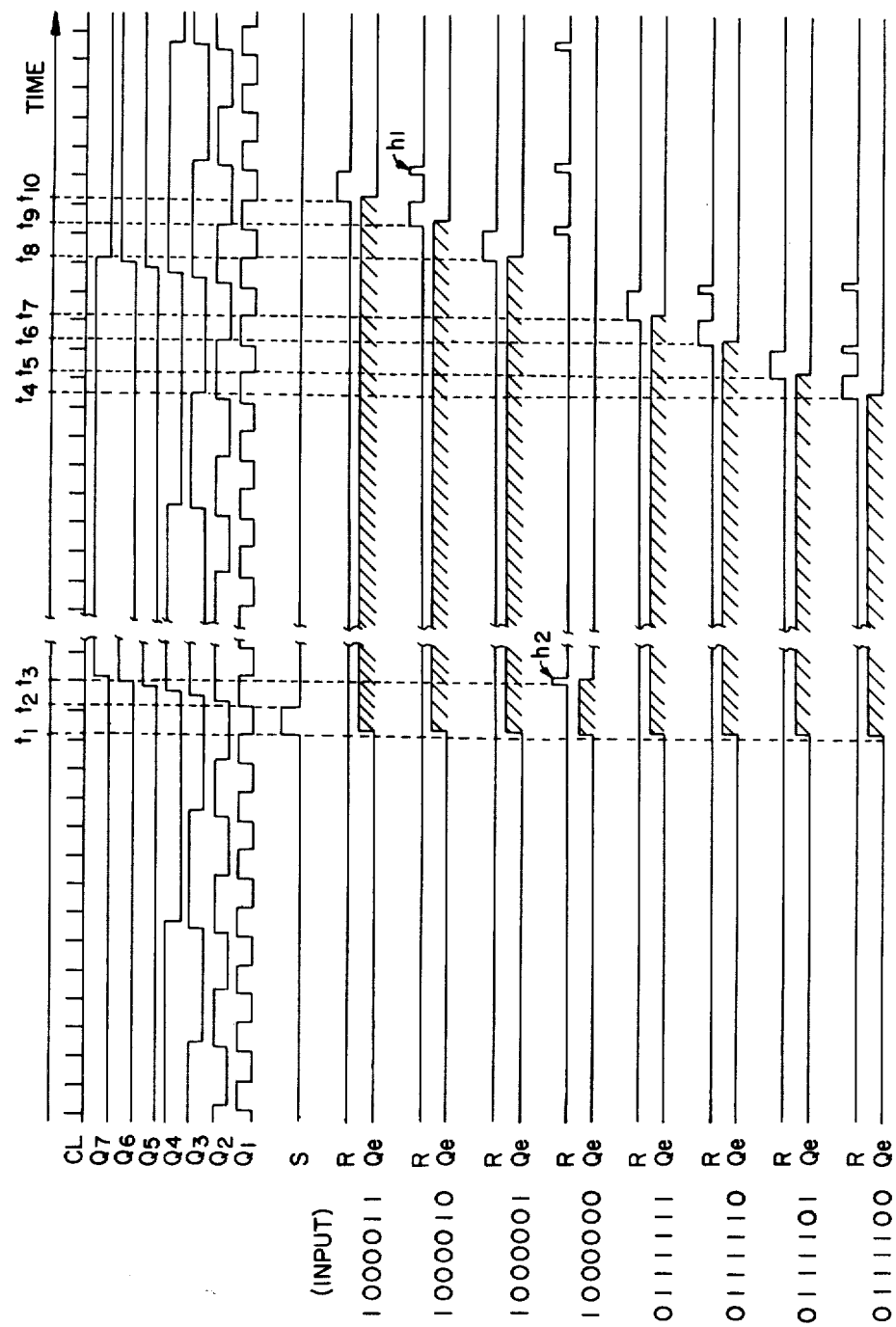
Figure 6:
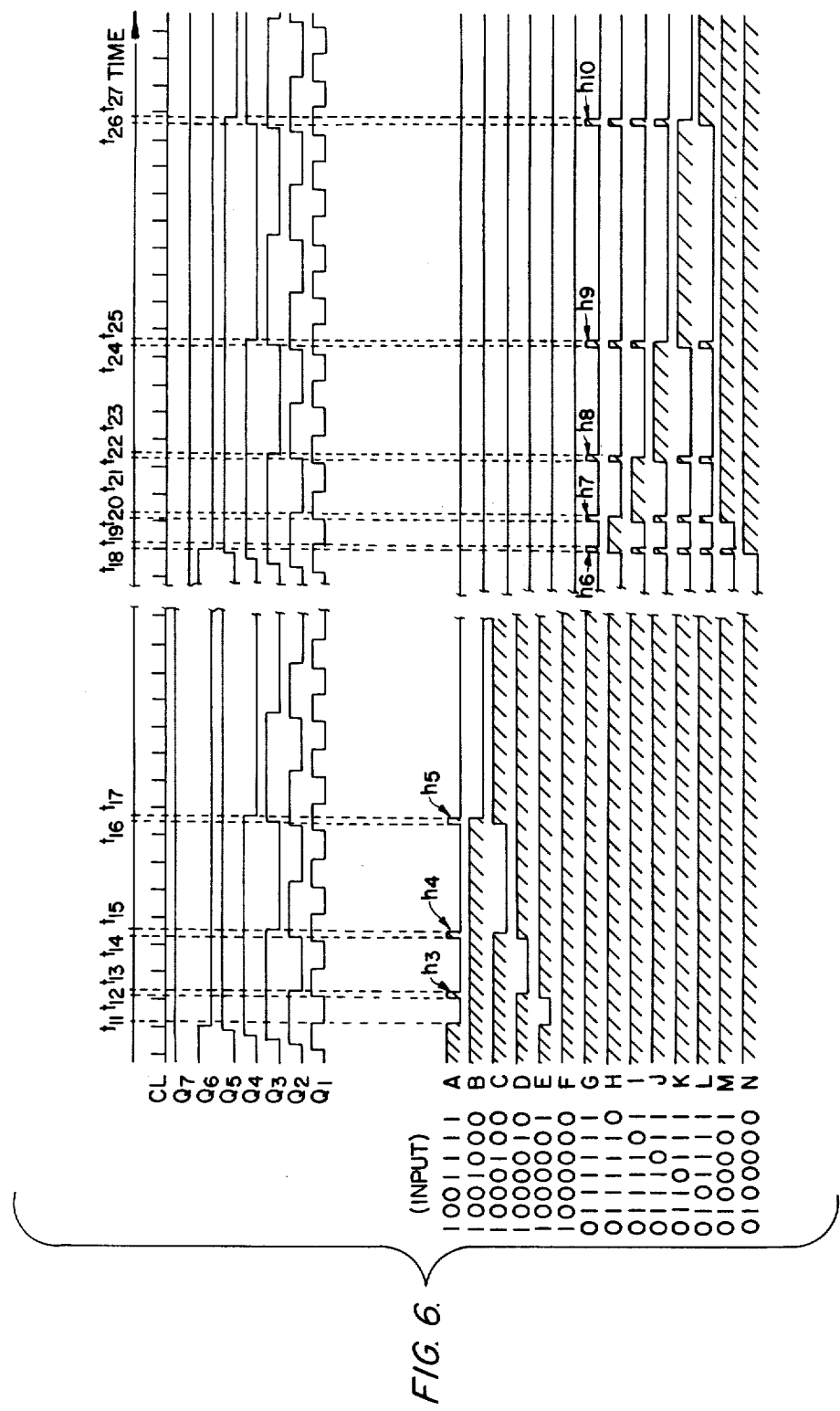

FIG. 6, in the same fashion as FIG. 3, shows the output signal waveforms for varying digital input values, assuming that in each flip-flop, a transfer delay which is equal to 1/6 of the clock pulse period will occur.

The output waveform, when [1001111] is applied as the digital input value, is affected by the transfer delay as glitches $h_3$, $h_4$ and $h_5$ as shown in FIG. 6-A. The apparatus in accordance with the present invention, however, does not trigger a flip-flop by means of the decoded output of the counter as in the conventional apparatus shown in FIG. 1, whereby these glitches cause no malfunction and no conversion error as discussed below.

As seen from FIG. 6-B, the active level duration, when [1001000] is applied as the digital input value, increases to an extent of seven clock pulse periods with respect to that in FIG. 6-A.

The duration, as shown in FIG. 6-D, increases to an extent of two clock pulse periods with respect to FIG. 6-C when [1000010] is applied.

Similarly, one clock pulse period further increases when [1000001] is applied and the same period further increases when [1000000] is applied.

Upon applying [0111111] as digital input value, the output signal, as shown in FIG. 6-G, is affected by glitches $h_6$, $h_7$, $h_8$, $h_9$, $h_{10}$, and $h_{11}$ (not shown), and a pulse width of each glitch corresponds to a transfer delay time of each flip-flop so as to thereby become equal to one clock to pulse period from six glitches. Consequently, the active level duration increases by one clock pulse period with respect to FIG. 6-F.

As seen from FIG. 6-H, the active level duration, when [0111110] is applied for digital input value, increases further by one clock pulse period, and is further increased by one clock pulse period when [0111101] is applied, and is further increased by two clock pulse period when [0111011] is applied, and is still further increased by four clock pulse periods when [0110111] is applied, and is further increased by eight clock pulse periods when [0101111] is applied (see FIGS. 6-I, -J, -K and -L).

It is seen from FIGS. 6-M and -N that the active level duration also increases by one clock pulse period when the digital input value is changed to [0100000] from [0100001].

As is seen from the above, the digital-to-analog conversion apparatus in accordance with the present invention need not use a synchronous counter of a high speed type as in conventional systems, so as to completely eliminate the conversion error caused by the transfer delay as well as malfunctions. Accordingly, the apparatus in accordance with the present invention, when using high speed gates which are the same as those used in conventional systems, can be used up to a high frequency only by a difference in the limit frequencies between the synchronous counter and a ripple counter, and when operated at a frequency which is about equal to that of the conventional apparatus, can actually reduce the number of gates and reduce the consumption of power.

Further referring to a reduction of the number of gates, the block surrounded by the broken line in FIG. 1, as abovementioned, is normally used to provide several channels. However, in comparison of the block with that shown by the broken line in FIG. 4, it will be seen that the apparatus in accordance with the present invention as shown in FIG. 4 can be composed of a far smaller number of gates due to the fact that the EX-OR gate generally comprises four NAND gates.

Now, FIGS. 3 and 6 assume that each flip-flop has a transfer delay which is equal to 1/6 of a clock pulse period, but actually, such flip-flops are often used at the frequency which is in closer proximity to the limit. Especially in $I^2L.IC$ or the like which is suitable to this kind of system, a method is taken which reduces an injection current as the ripple counter becomes a higher order. thereby saving the consumption power.

In such method, the digital-to-analog apparatus of the invention also functions stably without occurence of any conversion error.

Figure 7:
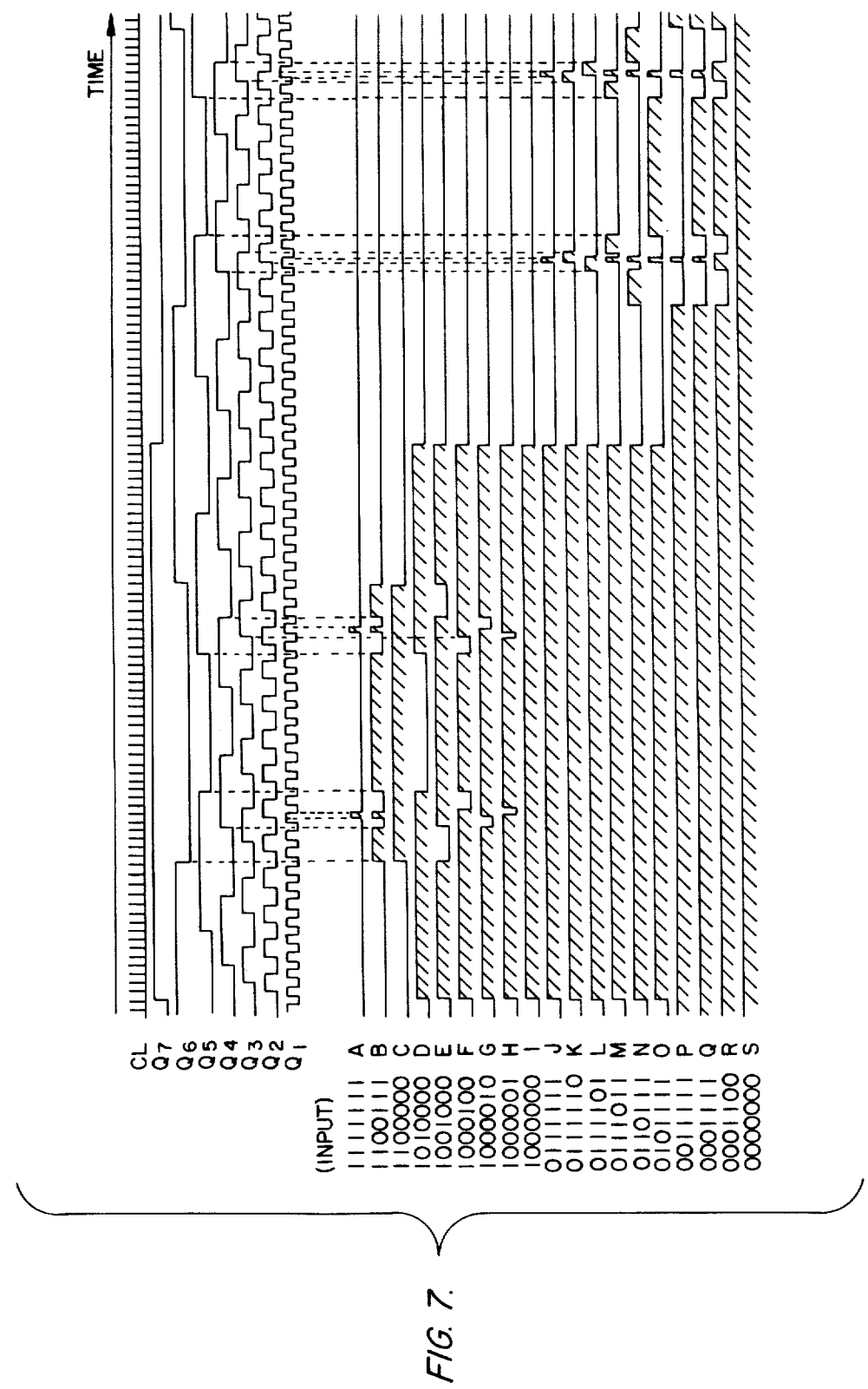

FIG. 7 shows the output waveforms for varying the digital input values, assuming that each flip-flop has a transfer delay time which is equal to ¼ of the triggering signal period, from which it is seen that the active-level duration, also in the above case, accurately changes so as to correspond to a change of the digital input value. For example, FIG. 7-I shows an output signal waveform when [1000000] is applied, in which the active-level duration is just ½ of the counting period of the 7-bit down-counter. When the digital input value decreases by 1 and becomes [0111111], glitches of ½ clock pulse period occur at two portions to increase the active level duration by one clock pulse period (see FIG. 7-J), and when the digital input value becomes [0111110], pulse widths of glitches apparently at two portions each become equal to one clock pulse period, thereby further increasing the duration by one clock pulse period (see FIG. 7-K).

As seen from the above, the digital-to-analog conversion apparatus in accordance with the present invention, even using a reference counter (7-bit down-counter in the FIG. 4 embodiment) and peripheral gates which have relatively large transfer delays is simple in construction and performs with a high accuracy without the occurence of a malfunction or a conversion error, as far as the reference counter keeps its function as the counter.

In addition, FIG. 4 shows the logic diagram of the embodiment of the invention designed thoroughly along the essence of the invention, in which the constitution of decoding gates or its decoding method, may alternatively be, for example, of a ROM type (an increased bit number will make it effective from the design of IC layout to adopt the ROM type), or the counter is not limited to a ripple or down counter, so that a synchronous counter may be used including the use of a dividing counter provided for other purposes.

The use of synchronous counter of course causes a considerable increase in the number of gates, but the apparatus in accordance with the present invention is still effective in reducing the number of gates due to the fact that the EX-OR gate comprising the conventional digital comparator can be replaced by only one AND gate.

In FIG. 4, NAND gate 35, NOR gate 36, OR gate 37, and AND gate 38 are so constituted that the output of AND gate 34 which constitutes a logical OR gate in the negative logic, when the MSB $D_7$ of the digital input is at a one level "1", becomes effective for one level "1" of the MSB ($Q_7$) at the counter (the level "1" in FIG. 4 alternatively may be "0"), and when the MSB of digital input value is at the other level "0", becomes effective for the other level "0" of the MSB at the counter. When the MSB at the digital input value is at one level "1", an output signal from the logical AND of the outputs of the counter (in the FIG. 4 embodiment, the output of T flip-flop 7) and AND gate 34 is obtained, and when the MSB of the digital input is at the other level "0", an output signal from the logical OR of the outputs of the counter and AND gate 34 is obtained. The reason for the above is that, throughly in consideration of the transient characteristics of the whole system, the system is designed so that no abrupt changes occur in the output signal waveform when the digital input value changes from [1000000] to [0111111]. Alternatively, the apparatus may be so constituted that the output of AND gate 34 is effective always when the MSB of the counter is "1" or "0", which may be rather simple in circuitry.

In addition, in the FIG. 4 embodiment, the inverted output which appears on the sixth bit of the counter is applied to the auxiliary gate, which is merely for technique on the circuitry composition, so that, even if the non-inverted output is applied to the auxiliary gate, this invention is not inferior in its essence.

What is claimed is:
1. A digital-to-analog conversion apparatus comprising:
   a binary counter having a clock pulse input terminal connected to a clock pulse source;
   a decoding gate means having a plurality of input terminals coupled to each of output bits of said binary counter and generating output signals of binary-weighted pulse widths respectively;
   a plurality of digital input terminals for receiving a digital input value;
   a plurality of logical NAND gates, wherein an input terminal of each of said logical NAND gates is respectively connected to an output terminal of one of said decoding gate means and wherein another input terminal of each of said logical NAND gates is respectively connected to one of said digital input terminals;
   a logical AND gate coupled to each output terminal of each of said NAND gates; and
   an output means for generating an output signal having an active-level duration which varies analog-like depending on said digital input value, said output means comprising:
   a first coincidence gate having a first input terminal coupled to the MSB of said binary counter and having a second input terminal coupled to the MSB of said digital input terminals;
   a second coincidence gate having a first input terminal coupled to the MSB of said binary counter and having a second input terminal coupled to the MSB of said digital input terminals;
   a third coincidence gate having a first input terminal coupled to an output terminal of said second coincidence gate and having a second input terminal coupled to an output terminal of said logical AND gate;
   a fourth coincidence gate having a first input terminal coupled to an output terminal of said first coincidence gate and having a second input terminal coupled to an output of said third coincidence gate.

* * * * *